US006784676B2

(12) United States Patent
Sherman

(10) Patent No.: US 6,784,676 B2
(45) Date of Patent: Aug. 31, 2004

(54) PRESSURIZED ELECTRICAL CONTACT SYSTEM

(75) Inventor: John H. Sherman, Lisle, NY (US)

(73) Assignee: International Business Machines Corporation, Armonk, NY (US)

(*) Notice: Subject to any disclaimer, the term of this patent is extended or adjusted under 35 U.S.C. 154(b) by 44 days.

(21) Appl. No.: 10/254,388

(22) Filed: Sep. 25, 2002

(65) Prior Publication Data

US 2004/0056649 A1 Mar. 25, 2004

(51) Int. Cl.$^{7}$ ................................................ G01R 31/02

(52) U.S. Cl. ....................................... 324/754; 324/760

(58) Field of Search ................................ 324/754, 755, 324/756, 757, 761, 158.1, 760

(56) References Cited

U.S. PATENT DOCUMENTS 4,820,976 A 4/1989 Brown
4,968,931 A 11/1990 Littlebury et al.
5,012,187 A 4/1991 Littlebury
5,252,916 A * 10/1993 Swart ......................... 324/757
5,604,446 A 2/1997 Sano
5,642,054 A 6/1997 Pasiecznik, Jr.
5,808,474 A * 9/1998 Hively et al. ............... 324/755
5,813,876 A 9/1998 Rutigliano
5,982,186 A 11/1999 Buschbom
6,071,137 A 6/2000 Rutigliano
6,147,506 A * 11/2000 Ahmad et al. .............. 324/760

* cited by examiner

*Primary Examiner*—Kamand Cuneo
*Assistant Examiner*—Tung X. Nguyen
(74) *Attorney, Agent, or Firm*—Schmeiser, Olsen & Watts; William E. Schiesser

(57) ABSTRACT

A method and structure to establish and maintain an electrical connection between electrical contacts. A bladder is placed within a fixture and pressurized. The pressurized bladder applies a force that will establish and maintain an electrical connection between a first contact pad and a second contact pad.

27 Claims, 5 Drawing Sheets

PRESSURIZED ELECTRICAL CONTACT SYSTEM

BACKGROUND OF THE INVENTION

1. Technical Field

The present invention relates to an apparatus and associated method to establish and maintain an electrical connection between electrical contacts.

2. Related Art

Establishing and maintaining an electrical connection between electrical contacts typically requires a complicated mechanical system of levers and springs. Such complicated systems may result in electrical connections that are unreliable. Thus there is a need for a simplified apparatus and method to establish and maintain a reliable electrical connection between electrical contacts.

SUMMARY OF THE INVENTION

The present invention provides an apparatus, comprising:

a fixture; and a bladder held within the fixture, wherein the bladder is adapted to be pressurized such that the pressurized bladder applies a force that establishes and maintains an electrical connection between a first contact pad and a second contact pad.

The present invention provides a method for creating an electrical connection, comprising:

providing a fixture; and pressurizing a bladder held within the fixture, wherein the pressurized bladder applies a force that establishes and maintains an electrical connection between a first contact pad and a second contact pad.

DETAILED DESCRIPTION OF THE INVENTION

Figure 1:
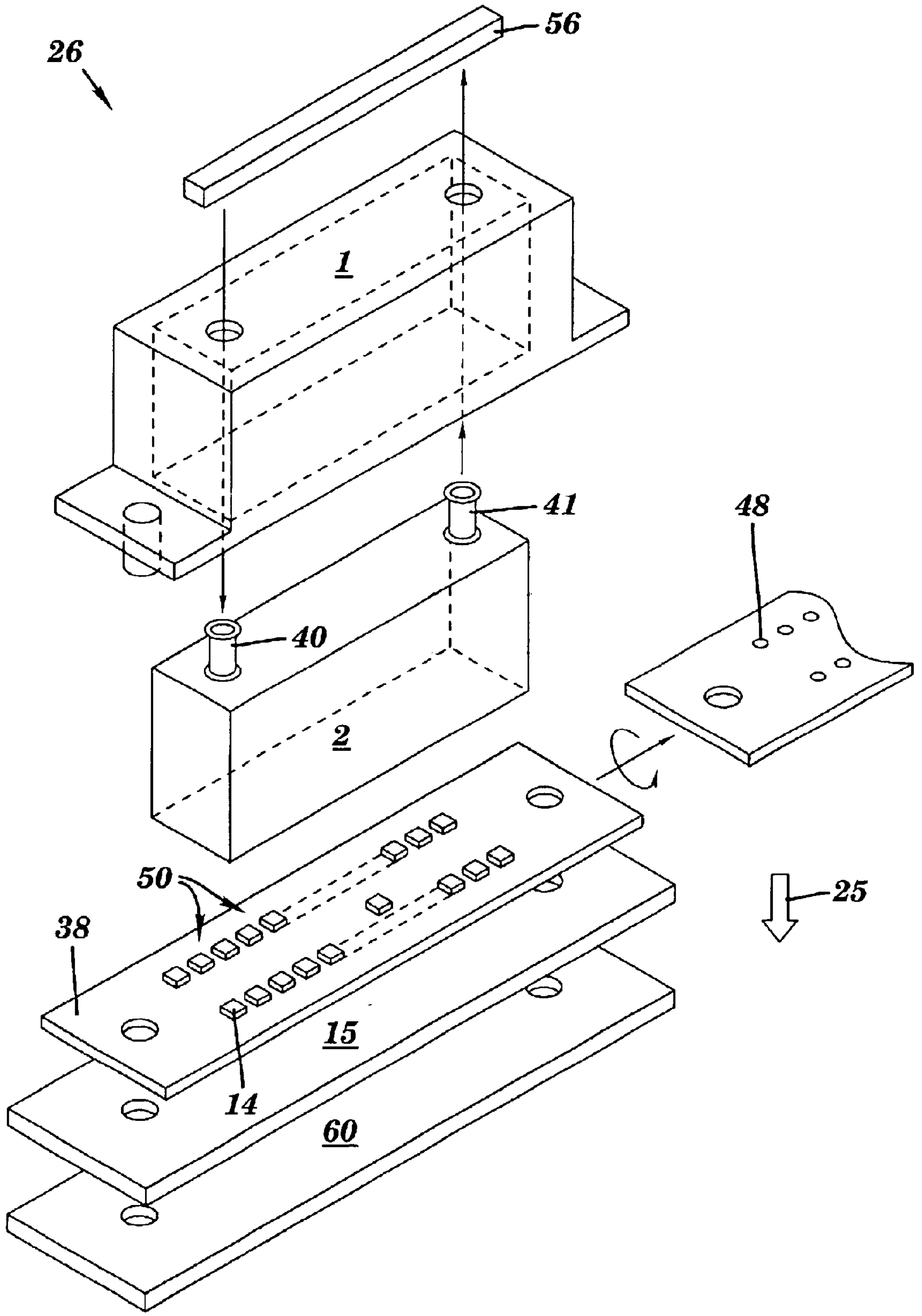
FIG. 1 depicts an exploded view of an apparatus using a pressurizing device to pressurize a bladder that will apply a force to a plurality of contacts, in accordance with embodiments of the present invention.

FIG. 1 illustrates an exploded view of an apparatus 26 using an external pressurizing device 56 to pressurize a bladder 2 that will apply a force to a plurality of contact buttons 50, in accordance with embodiments of the present invention. The bladder 2 may be enclosed within a fixture 1. The bladder 2 is pressurized with a fluid (e.g., a pneumatic substance or hydraulic substance) such that the bladder 2 exerts a force in a direction 25 on a contact button 14 or on a plurality of contact buttons 50. The contact button 14 will establish and maintain an electrical connection between a first contact pad 8 and a second contact pad 10 (i.e., shown in FIG. 5). The plurality of contact buttons 50 will establish and maintain electrical connections between a plurality of electrical contacts. The bladder 2 may establish and maintain an electrical connection between a first contact pad 8 and a second contact pad 10 without the use of the contact button 14 (i.e., shown in FIG. 7). The first contact pad 8 may be placed on a first substrate 5 and the second contact pad 10 may placed on a second substrate 15 (shown in FIG. 5) or the first contact pad 8 and the second contact pad 10 may be placed on a same substrate. The contact button 14 may be used in an electrical conductor between the first contact pad 8 and the second contact pad 10 (i.e., shown in FIG. 3). The first contact pad 8 and the second contact pad 10 each comprise a mating surface. A mating surface is described herein as a surface on a contact pad (e.g., the first contact pad 8) that makes an electrical connection to another contact pad (e.g., the second contact pad 10) or a contact button (e.g., the contact button 14). The mating surface of the first contact pad 8 may be planer. The mating surface of the second contact pad 10 may be planer. The contact button 14 may activate a switch that is electrically coupled between the first contact pad 8 and the second contact pad 10. The first contact pad 8 may be coupled to a first electrical component (e.g., a semiconductor chip) and the second contact pad 10 may be coupled to a second electrical component (e.g., an electrical resistor). The plurality of contact buttons 50 may be at different levels within a range of about loss than or equal to 6 mils, with respect to the direction 25. The contact button 14 may be integral with the bladder 2 (i.e., shown in FIG. 2) or the contact button 14 may be held in place by a retainer plate 38 with a via 48 that will allow the contact button 14 to move in the direction 25 and opposite to the direction 25. The place 38 may be the first substrate 5 (shown in FIG. 4). The first substrate 5 and the second substrate 15 may each include, inter alia, a printed circuit board or a flexible circuit. An external pressurizing device 56 may be used to pressurize the bladder 2. The external pressurizing device 56 may be a pneumatic device that uses a pneumatic substance such as, inter alia, air or other gas. The pneumatic substance will enter the bladder 2 through a port 40 and may exit through a port 41 so that a constant flow is established. The pneumatic substance may be thermally conductive, thereby providing a heat sink for the electrical connections. The external pressurizing device 56 may alternatively be a hydraulic device 57 that uses a hydraulic substance such as, inter alia, water or oil. The hydraulic substance will enter the bladder 2 through a port 40 and may exit through a port 41 so that a constant flow is established. The hydraulic substance may be thermally conductive, thereby providing a heat sink for the electrical connections. The bladder 2 is not limited to any specific shape and may include a variety of geometrical shapes (e.g., circle, square, rectangle etc.). A substrate 60 is used as a stiffener that may be placed below the second substrate 15 to provide support for the apparatus 26. The substrate 60 may comprise, inter alia, metal or plastic.

Figure 2:
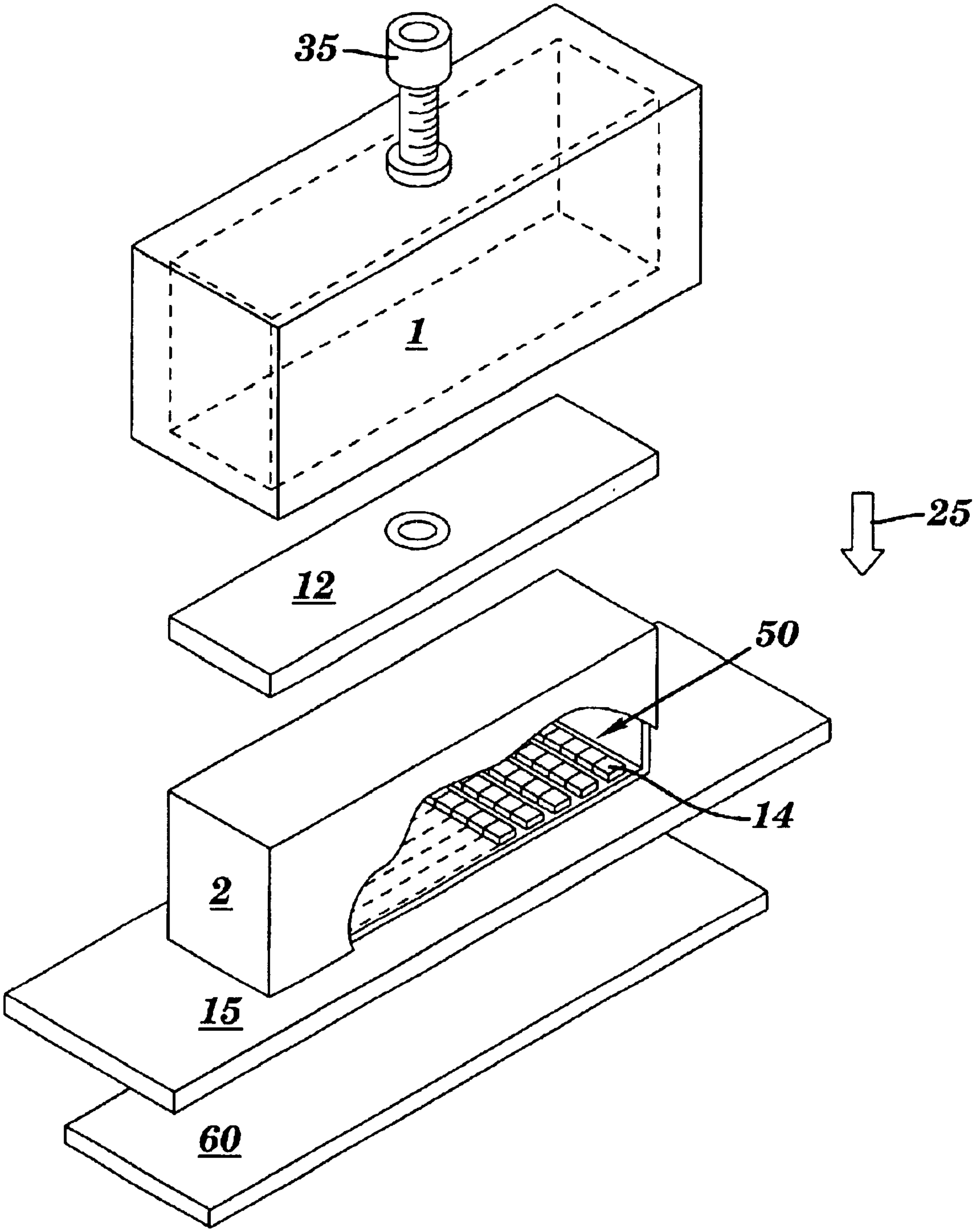
FIG. 2 depicts an exploded view of an apparatus using a mechanical device to pressurize a bladder that will apply a force to a plurality of contacts, in accordance with embodiments of the present invention.

FIG. 2 illustrates an exploded view of a variant of the apparatus 26 of FIG. 1 using a mechanical device to pressurize a bladder 2 that will apply a force to a plurality of contact buttons 14, in accordance with embodiments of the present invention. A pressure bar 12, which embodies the mechanical device, is placed on a side 19 of the bladder 2 and a fixture 1 is placed over the pressure bar 12 and the bladder 2. The bladder 2 contains a liquid or gas substance such that the bladder 2 is less than fully pressurized. The bladder 2 is fully pressurized by turning a drive mechanism 35 into a threaded opening in the fixture 1, wherein the pressure bar 12 is forced down (i.e. in a direction 25) on to the bladder 2. The bladder 2 exerts a force in the direction 25 on a contact button 14 or on a plurality of contact buttons 50. The contact button 14 will establish and maintain an electrical connection between a first contact pad 8 and a second contact pad 10 (i.e., shown in FIG. 5). The plurality of contact buttons 50 will establish and maintain electrical connections between a plurality of electrical contacts. The bladder 2 may establish and maintain an electrical connection between a first contact pad 8 and a second contact pad 10 without the use of the contact button 14 (i.e., shown in FIG. 7). The first contact pad 8 may be placed on a first substrate 5 and the second contact pad 10 may placed on a second substrate 15 (shown in FIG. 5) or the first contact pad 8 and the second contact pad 10 may be placed on a same substrate. The contact button 14 may be used as an electrical conductor between the first contact pad 8 and the second contact pad 10 (i.e., shown in FIG. 3). The contact button 14 may activate a switch that is electrically coupled between the first contact pad 8 and the second contact pad 10. The first contact pad 8 may be coupled to a first electrical component (e.g., a semiconductor chip) and the second contact pad 10 may be coupled to a second electrical component (e.g., an electrical resistor). The plurality of contact buttons 50 may be at different levels within a range of about less than or equal to 6 mils, with respect to the direction 25. The contact button 14 may be integral with the bladder 2 as shown or the contact button 14 may be held in place by a retainer plate 38 with a via 48 (see FIG. 1) that will allow the contact button 14 to move in the direction 25 and opposite to the direction 25. The plate 38 may be the first substrate 5 (i.e., as shown in FIG. 4). The first substrate 5 and the second substrate 15 may each include, inter alia, a printed circuit board or a flexible circuit. The bladder 2 is not limited to any specific shape and may include a variety of geometrical shapes (e.g., circle, square, rectangle etc.). A substrate 60 is used as a stiffener that may be placed below the second substrate 15 to provide support for the apparatus 26. The substrate 60 may comprise, inter alia, metal or plastic.

Figure 3:
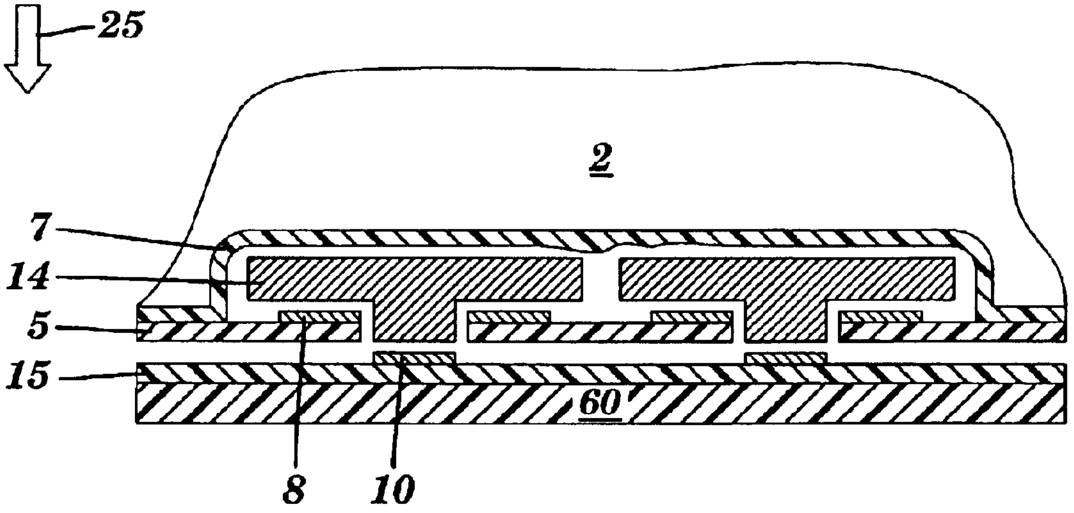
FIG. 3 depicts a cross sectional view of a bladder that will apply a force to a contact button that is integral with the bladder, in accordance with embodiments of the present invention
Figure 4:
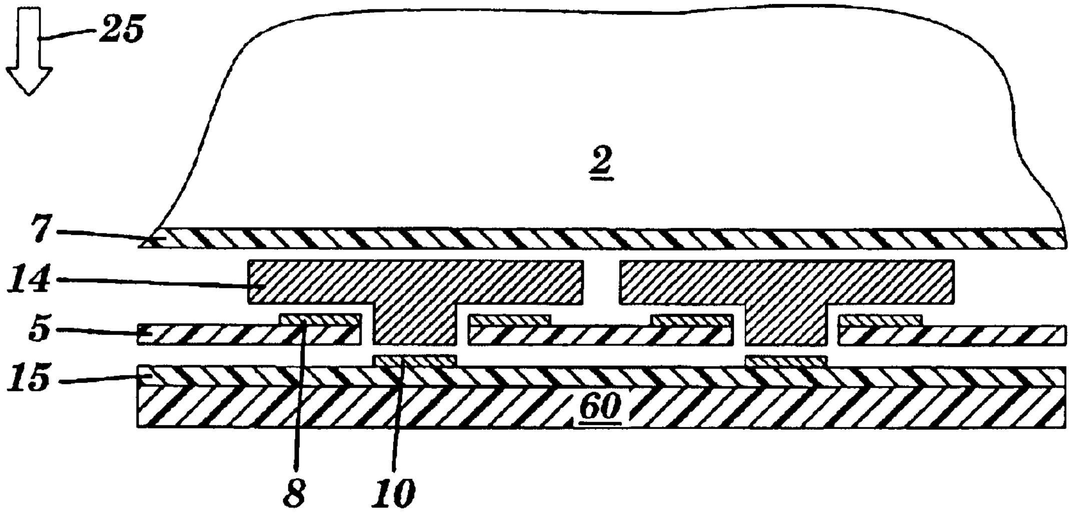
FIG. 4 depicts a cross sectional view of a bladder that will apply a force to a contact button, in accordance with embodiments of the present invention.
Figure 7:
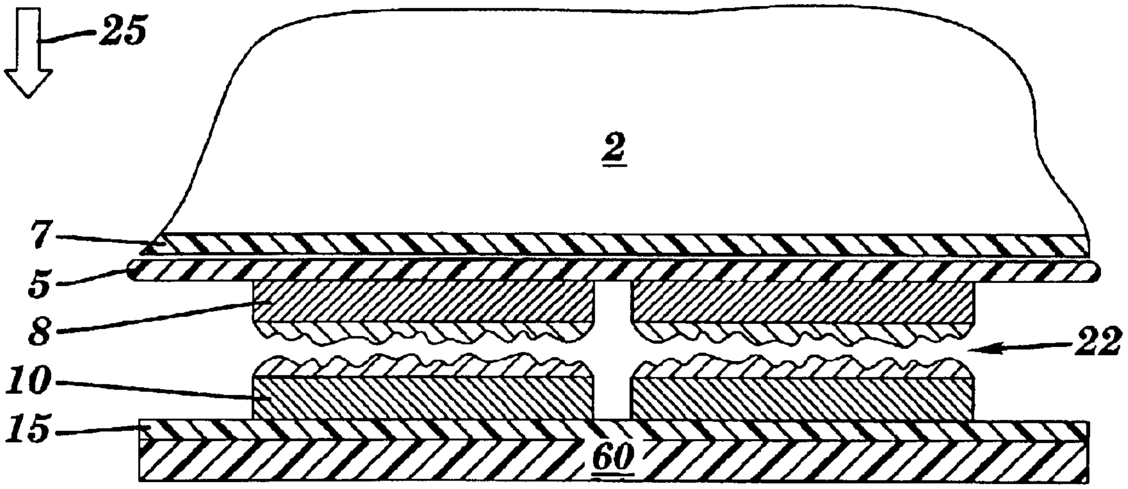
FIG. 7 depicts a cross sectional view of a bladder that will apply a force to a substrate, in accordance with embodiments of the present invention.

FIG. 3 illustrates a cross sectional view of a bladder 2 that will apply a force to a contact button 14 that is integral with the bladder 2, in accordance with embodiments of the present invention. The bladder 2 may be pressurized by using a mechanical, hydraulic, or pneumatic device. The bladder 2 is pressurized, exerting a force in a direction 25 on a contact button 14 or on a plurality of contact buttons. A membrane 7 that is integral with the bladder 2 may be used between the bladder 2 and the contact button 14. The contact button 14 will establish and maintain an electrical connection between a first contact pad 8 and a second contact pad 10. Similarly, the plurality of contact buttons 50 (see FIG. 1) will establish and maintain electrical connections between a plurality of electrical contacts. The first contact pad 8 may be placed on a first substrate 5 that is integral with the membrane 7 and the bladder 2 and therefore the first substrate 5 will hold the contact button 14 in place. The second contact pad 10 may placed on a second substrate 15. Alternatively the first contact pad 8 and the second contact pad 10 may be placed on a same substrate. The contact button 14 may be used as an electrical conductor between the first contact pad 8 and the second contact pad 10. The contact button 14 may activate a switch that is electrically coupled between the first contact pad 8 and the second contact pad 10. The first contact pad 8 may be coupled to a first electrical component (e.g., a semiconductor chip) and the second contact pad 10 may be coupled to a second electrical component (e.g., an electrical resistor). The plurality of contact buttons may be at different levels within a range of about less than or equal to 6 mils, with respect to the direction 25. The mating surface of the contact pad 8 and the contact pad 10 may comprise a dendritic interface 22 (i.e., as shown in FIG. 7). The first substrate 5 and the second substrate 15 may each include, inter alia, a printed circuit board or a flexible circuit. The bladder 2 is not limited to any specific shape and may include a variety of geometrical shapes (e.g., circle, square, rectangle etc.). A substrate 60 is used as a stiffener that may be placed below the second substrate 15 to provide support for the apparatus 26. The substrate 60 may comprise, inter alia, metal or plastic.

FIG. 4 illustrates a variation of FIG. 3 showing a cross sectional view of a bladder 2 that will apply a force to a contact button 14, in accordance with embodiments of the present invention. In contrast with FIG. 3 the contact button 14 and a first substrate 5 are not integral with the bladder 2. A membrane 7 that is integral with the bladder 2 may be used between the bladder 2 and the contact button 14 but in contrast with FIG. 3, the membrane 7 is not integral with the first substrate 5.

Figure 5:
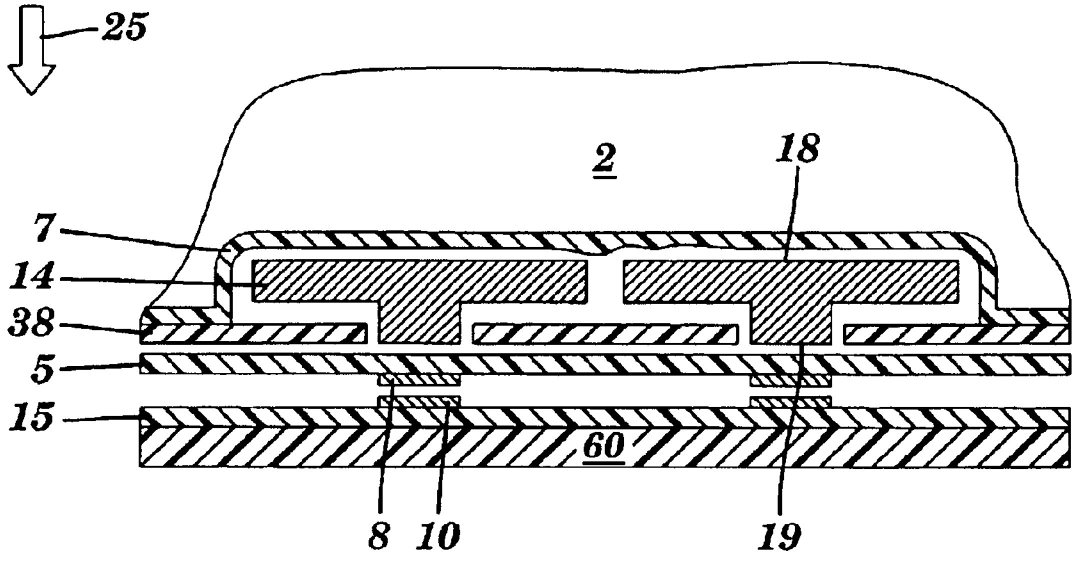
FIG. 5 depicts a cross sectional view of a bladder that will apply a force to a contact button that is integral with the bladder and uses a retainer plate to hold the contact button in place, in accordance with embodiments of the present invention.

FIG. 5 illustrates a variation of FIG. 3 showing a cross sectional view of a bladder 2 that will apply a force to a contact button 14 that is integral with the bladder 2, in accordance with embodiments of the present invention. A first side 18 of the contact button 14 may have an area that is greater than an area on a second side 19 of the contact button 14. The bladder 2 will apply a pressure to the first side 18 of the contact button 14. The pressure applied to the first side 18 of the contact button 14 will be transferred to the second side 19 of the contact button as a concentrated load on the smaller area on the second side 19 of the contact button 14, thereby creating a larger pressure on the second side 19 of the contact button 14 than is applied to the front side 18 of the contact button 14. A similar increase in pressure applies likewise to the contact button 14 in each of the FIGS. 1–7, as discussed infra. In contrast with FIG. 3, a first substrate 5 is not integral with the bladder 2 making the first substrate 5 an individual component. A membrane 7 that is integral with the bladder 2 may be used between the bladder 2 and the contact button 14 but in contrast with FIG. 3, a retainer plate 38 that is integral with the membrane 7 is used to hold the contact button 14 in place.

Figure 6:
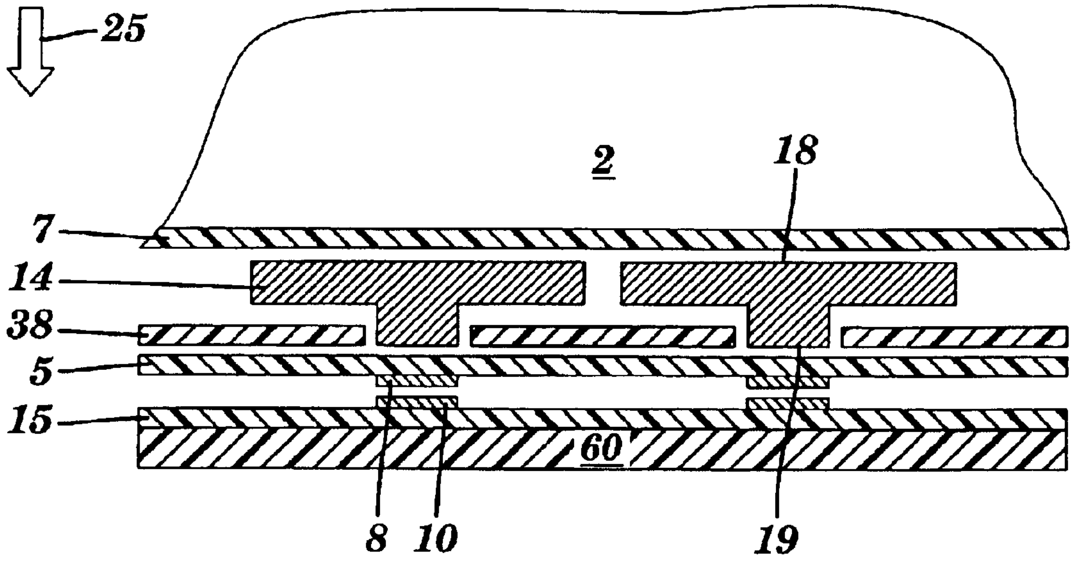
FIG. 6 depicts a cross sectional view of a bladder that will apply a force to a contact button and uses a retainer plate to hold the contact button in place, in accordance with embodiments of the present invention.

FIG. 6 illustrates a variation of FIG. 3 showing a cross sectional view of a bladder 2 that will apply a force to a contact button 14, in accordance with embodiments of the present invention. In contrast with FIG. 3, the contact button 14 and a first substrate 5 are not integral with the bladder 2 and an individual retainer plate 38 is used. A membrane 7 that is integral with the bladder 2 may be used between the bladder 2 and the contact button 14 but in contrast to FIG. 3 the membrane 7 is not integral with the first substrate 5.

FIG. 7 illustrates a cross sectional view of a bladder 2 that will apply a force to a first substrate 5, in accordance with embodiments of the present invention. The bladder 2 may be pressurized by using a mechanical, hydraulic, or pneumatic device. The bladder 2 is pressurized, exerting a force in a direction 25 upon the first substrate 5. The first substrate 5 applies a force in the direction 25 upon a first contact pad 8 and thus the substrate 5 will establish and maintain an electrical connection between the first contact pad 8 and a second contact pad 10. The substrate 5 may be used to establish and maintain electrical connections between a plurality of electrical contacts. The first contact pad 8 may be placed on the first substrate 5 and the second contact pad 10 may placed on a second substrate 15, or the first contact pad 8 and the second contact pad 10 may be placed on a same substrate. The mating surface of the contact pad 8 and the contact pad 10 may comprise a dendritic interface 22. The first contact pad 8 may be coupled to a first electrical component (e.g., a semiconductor chip) and the second contact pad 10 may be coupled to a second electrical component (e.g., an electrical resistor). A plurality of first contact pads 8 may be at different levels within a range of about less than or equal to 6 mils, with respect to the direction 25. A membrane 7 may be used between the bladder 2 and the substrate 5. The first substrate 5 and the second substrate 15 may include, inter alia, a printed circuit board or a flexible circuit. The bladder 2 is not limited to any specific shape and may include a variety of geometrical shapes (e.g., circle, square, rectangle etc.). A substrate 60 may be used as a stiffener that may be placed in contact with the second substrate 15 to provide support for the apparatus 26. The substrate 60 may comprise, inter alia, metal or plastic.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An apparatus, comprising:

a fixture;

a first contact pad comprising a first planer mating surface;

a second contact pad comprising a second planer mating surface; and a bladder held within the fixture, wherein the bladder is adapted to be pressurized such that the pressurized bladder applies a force that establishes and maintains an electrical connection between the first planer mating surface of the first contact pad and the second planer mating surface of the second contact pad.

2. The apparatus of claim 1, further comprising a first contact button, wherein the pressurized bladder applies the force upon the first contact button, and wherein the force applied upon the first contact button establishes and maintains the electrical connection between the first planer mating surface of the first contact pad and the second planer mating surface of the second contact pad.

3. The apparatus of claim 2, wherein a first side of the first contact button has an area that is greater than an area of a second side of the first contact button, and wherein a pressure applied by the second side of the first contact button establishes and maintains the electrical connection between the first planer mating surface of the first contact pad and the second planer mating surface of the second contact pad.

4. The apparatus of claim 2, wherein the first contact button is integral with the bladder.

5. The apparatus of claim 2, further comprising:

a second contact button;

a third contact and comprising a third planer mating surface; and a fourth contact pad comprising a fourth planer mating surface, wherein the pressurized bladder applies the force to the second contact button, wherein the second contact button establishes and maintains an electrical connection between the third planer mating surface of the third contact pad and the fourth planer mating surface of the fourth contact pad, and wherein the first and second contact buttons are at different levels with respect to the direction of the applied force.

6. The apparatus of claim 1, wherein the first contact pad is on a first substrate and the second contact pad is on a second substrate.

7. The apparatus of claim 1, wherein an external pneumatic device is used to pressurize the bladder.

8. The apparatus of claim 1, wherein an external hydraulic device is used to pressurize the bladder.

9. The apparatus of claim 1, wherein the bladder is less than fully pressurized, and wherein a mechanical device is used to pressurize to the bladder.

10. The apparatus of claim 1, wherein an elastomeric membrane is disposed around the bladder.

11. A method for creating an electrical connection, comprising:

providing a fixture, a bladder, a first contact pad comprising a first planer mating surface, and a second contact pad comprising a second planer mating surface;

pressurizing the bladder held within the fixture, wherein the pressurized bladder applies a force that establishes and maintains an electrical connection between the first planer mating surface of the first contact pad and the second planer mating surface of the second contact pad.

12. The method of claim 11, further comprising providing a first contact button, wherein the pressurized bladder applies the force upon the first contact button, and wherein the force applied upon the first contact button establishes and maintains the electrical connection between the first planer mating surface of the first contact pad and the second planer mating surface of the second contact pad.

13. The method of claim 11, wherein a first side of the first contact button has an area that is greater than an area of a second side of the first contact button, and wherein a pressure applied by the second side of the first contact button establishes and maintains the electrical connection between the planer mating surface of the first contact pad and the second planer mating surface of the second contact pad.

14. The method of claim 12, wherein the first contact button is not integral with the bladder.

15. The method of claim 12, further comprising providing a second contact button, a third contact pad comprising a third planer mating surface, and a fourth contact pad comprising a fourth planer mating surface, wherein the pressurized bladder applies the force to a second contact button, wherein the second contact button establishes and maintains an electrical connection between the third planer mating surface of the third contact pad and the fourth planer mating surface of the fourth contact pad, and wherein the first and second contact buttons are at different levels with respect to the direction of the applied force.

16. The method of claim 11, wherein the first contact pad is on a first substrate and the second contact pad is on a second substrate.

17. The method of claim 11, wherein pressurizing the bladder comprises pressurizing the bladder by using an external pneumatic device.

18. The method of claim 11, wherein the bladder is pressurized by a fluid that is thermally conductive.

19. The method of claim 11, wherein pressurizing the bladder comprises pressurizing the bladder by using an external hydraulic device.

20. The method of claim 11, wherein pressurizing the bladder comprises providing a bladder that is less than fully pressurized, and wherein pressurizing the bladder comprises pressurizing the bladder by using a mechanical device.

21. An apparatus, comprising:

a fixture; and a bladder comprising a first port and a second port, wherein the bladder is held within the fixture, wherein the bladder is adapted to be pressurized with a substance such that the pressurized bladder applies a force that establishes and maintains an electrical connection between a first contact pad and a second contact pad, wherein the substance is adapted to enter the bladder through a first port and exit the bladder through a second port such that a constant flow is established, wherein the substance is a thermally conductive substance such that the thermally conductive substance is adapted to provide a heat sink for the electrical connection between a first contact pad and a second contact pad.

22. The apparatus of claim 21, wherein the thermally conductive substance is a pneumatic substance.

23. The apparatus of claim 21, wherein the thermally conductive substance is a hydraulic substance.

24. The apparatus of claim 21, wherein the pressurized bladder applies a force upon a first contact button, and wherein the force applied upon the first contact button establishes and maintains the electrical connection between the first contact pad and the second contact pad.

25. An apparatus, comprising:

a fixture;

a first contact pad comprising a first dendritic mating surface;

a second contact pad comprising a second dendritic mating surface;

a bladder held within the fixture, wherein the bladder is adapted to be pressurized such that the pressurized bladder applies a force that establishes and maintains an electrical connection between the first dendritic mating surface of the first contact pad and the second dendritic mating surface of the second contact pad.

26. The apparatus of claim 25, further comprising a first contact button, wherein the pressurized bladder applies the force upon the first contact button, and wherein the force applied upon the first contact button establishes and maintains the electrical connection between the first dendritic mating surface of the first contact pad and the second dendritic mating surface of the second contact pad.

27. The apparatus of claim 26, further comprising:

a second contact button;

a third contact pad comprising a third dendritic mating surface; and a fourth contact pad comprising a fourth dendritic mating surface, wherein the pressurized bladder applies the force to the second contact button, wherein the second contact button establishes and maintains an electrical connection between the third dendritic mating surface of the third contact pad and the fourth dendritic mating surface of the fourth contact pad, and wherein the first and second contact buttons are at different levels with respect to the direction of the applied force.

* * * * *